(12) United States Patent
Adamski

(10) Patent No.: US 8,493,128 B2
(45) Date of Patent: Jul. 23, 2013

(54) RF SWITCHING SYSTEM, MODULE, AND METHODS WITH IMPROVED HIGH FREQUENCY PERFORMANCE

(75) Inventor: Jaroslaw Adamski, Streamwood, IL (US)

(73) Assignee: Peregrine Semiconductor Corporation, San Diego, CA (US)

( * ) Notice: Subject to any disclaimer, the term of this patent is extended or adjusted under 35 U.S.C. 154(b) by 0 days.

(21) Appl. No.: 13/232,893

(22) Filed: Sep. 14, 2011

(65) Prior Publication Data

US 2012/0274387 A1    Nov. 1, 2012

Related U.S. Application Data

(60) Provisional application No. 61/481,188, filed on Apr. 30, 2011.

(51) Int. Cl.
*H01P 1/22* (2006.01)

(52) U.S. Cl.
USPC .......................................... 327/365; 327/427

(58) Field of Classification Search
USPC .................................. 327/365, 376, 377, 427
See application file for complete search history.

(56) References Cited

U.S. PATENT DOCUMENTS

| | | | | |
|---|---|---|---|---|
| 5,731,607 A | * | 3/1998 | Kohama | 257/275 |
| 7,221,207 B2 | * | 5/2007 | Fukumoto et al. | 327/365 |
| 7,796,969 B2 | * | 9/2010 | Kelly et al. | 455/333 |
| 8,159,282 B2 | * | 4/2012 | Katoh et al. | 327/427 |

* cited by examiner

*Primary Examiner* — Hai L Nguyen
(74) *Attorney, Agent, or Firm* — Jaquez & Associates; Martin J. Jaquez, Esq.; Merle Richman, Esq.

(57) ABSTRACT

Embodiments of radio frequency switching systems, modules, and methods with improved high frequency performance are described generally herein where the switching module may include a first switch module coupled in series to a second switch module, and a third switch module coupled between the first and the second module and ground. A controllable element of the second module may have a lower off capacitance than a controllable element of the first module. Other embodiments may be described and claimed.

20 Claims, 4 Drawing Sheets

RF SWITCHING SYSTEM, MODULE, AND METHODS WITH IMPROVED HIGH FREQUENCY PERFORMANCE

CROSS-REFERENCE TO RELATED UTILITY AND PROVISIONAL APPLICATIONS—CLAIMS OF PRIORITY

The present application claims the benefit under 35 U.S.C. §119(e) of U.S. Provisional Application No. 61/481,188, filed Apr. 30, 2011. The present application is related to the application set forth above. The application set forth above is hereby incorporated by reference herein as if set forth in full.

TECHNICAL FIELD

Various embodiments described herein relate generally to radio frequency switching systems, modules, and methods and particularly with high breakdown voltages.

BACKGROUND INFORMATION

It may be desirable to switch RF signals having high voltage levels while not distorting high frequencies at a load; the present invention provides a system, method, and apparatus for same.

DETAILED DESCRIPTION

Figure 1:
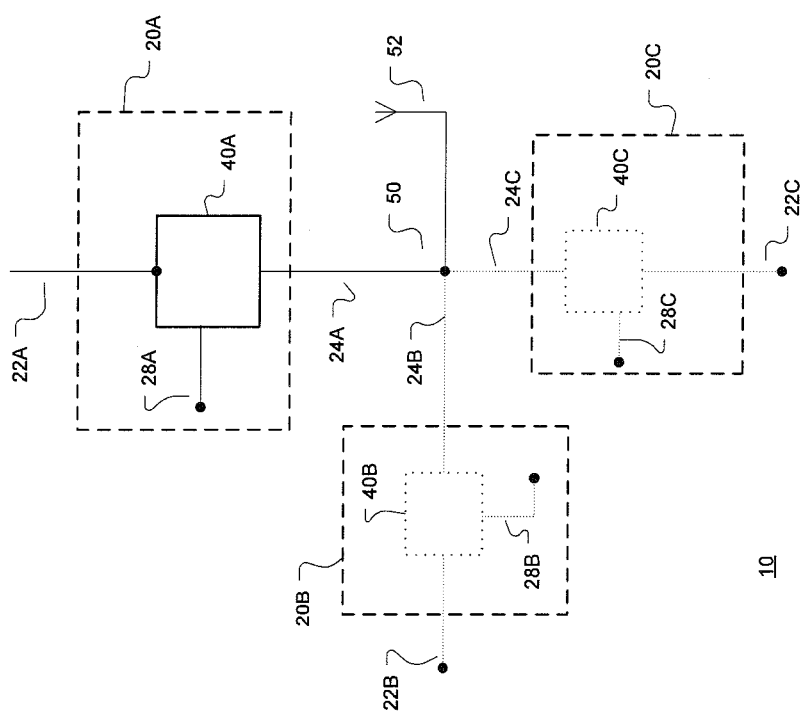
FIG. 1 is a block diagram of a signal processing system according to various embodiments.

FIG. 1 is a block diagram of a signal processing system 10 according to various embodiments. As shown in FIG. 1, the system 10 includes multiple signal processing modules 20A, 20B, 20C coupled to a common node 50 and an antenna 52. The antenna 52 may be coupled to the common node 50 and transceive signals with the common node 50. Each signal processing module 20A, 20B, 20C may receive and process a signal 22A, 22B, 22C to generate the signals 24A, 24B, and 24C, respectively. The processed signals 24A, 24B, 24C may be coupled to the antenna 52 via the common node 50.

In an embodiment each signal processing module 20A, 20B, and 20C may include a radio frequency (RF) switching module 40A, 40B, 40C, respectively. The switching module 40A, 40B, 40C may switch the signal 22A, 22B, 22C to generate the signal 24A, 24B, 24C based on a control signal 28A, 28B, 28C, respectively.

A control or bias signal 28A, 28B, 28C may be coupled to a RF switching module 40A, 40B, 40C, respectively. An RF switching module 40A, 40B, 40C may process the signal 22A, 22B, 22C based on the signal 28A, 28B, 28C, respectively. In an embodiment the signal processing modules 20A, 20B, 20C may form a multiple pole switch and each module 20A, 20B, 20C may be a single pole (switch). Further only a single pole of the effective multiple pole switch network or module 10 may be active at any given time to prevent or limit interference between signals 24A, 24B, 24C at the common node 50. Accordingly when a switching module 40A, 40B, 40C is active, the other two switching modules may be inactive. The inactive switches 40A, 40B, or 40C may produce an off-state capacitance that may result in an increased switch attenuation limiting the switch band width.

Figure 2A:
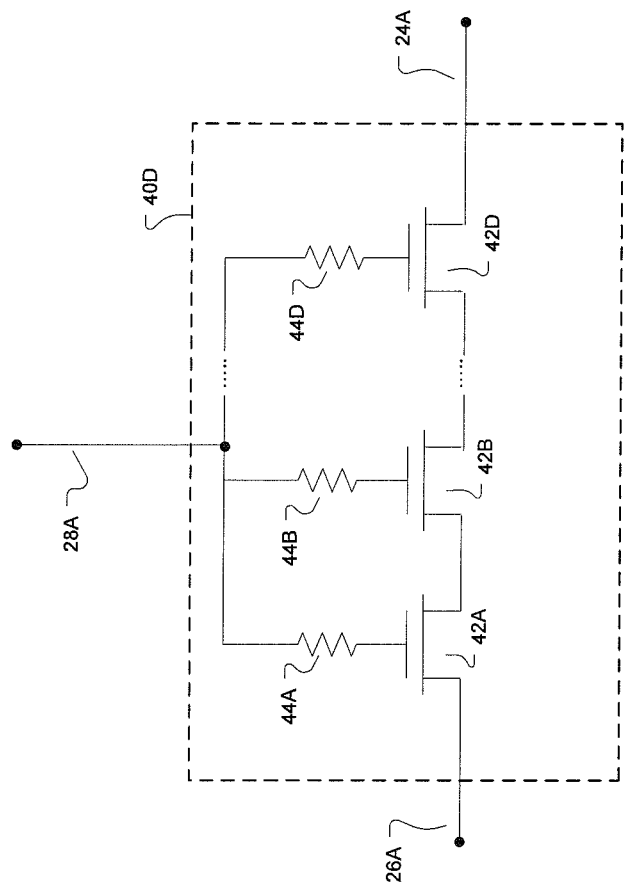
FIG. 2A is a block diagram of an RF switching module according to various embodiments.

The inactive switches 40A, 40B, 40C may need to withstand the present of a high voltage signal on their ports (from the input signals 22A, 22B, and 22C) and from the common node 50. Accordingly the switches 40A, 40B, 40C may be required to have sufficient loading capability. Further the modules or switches 40A, 40B, 40C insertion loss for an input signal 22A, 22B, 22C should be low in an embodiment. FIG. 2A is a block diagram of an RF switching module 40D according to various embodiments. As shown in FIG. 2A a switching module 40D may include one or more controllable elements or modules such as multiple n-type or p-type complementary metal-oxide-semiconductor N-CMOS transistors 42A to 42D. Each transistor 42A to 42D may be coupled to a control signal 28A via a resistor 44A to 44D.

The module 40A may include multiple transistors to handle large voltage or loads from a signal 26A, 24A given each transistor has a breakdown voltage and series coupled transistors may process voltage equal to the sum of the breakdown voltage of each of the series coupled transistors 42A to 42D as described in the commonly assigned U.S. Pat. No. 6,804,502 entitled Switch Circuit and Method of Switching Radio Frequency Signals to Mark Burgener et al., which is hereby incorporated by reference for its teachings. The switching module 40A may introduce capacitance into a node 50 when the switch 40A is inactive. The capacitance may vary as a function of the transistors 42A to 42D.

Figure 2B:
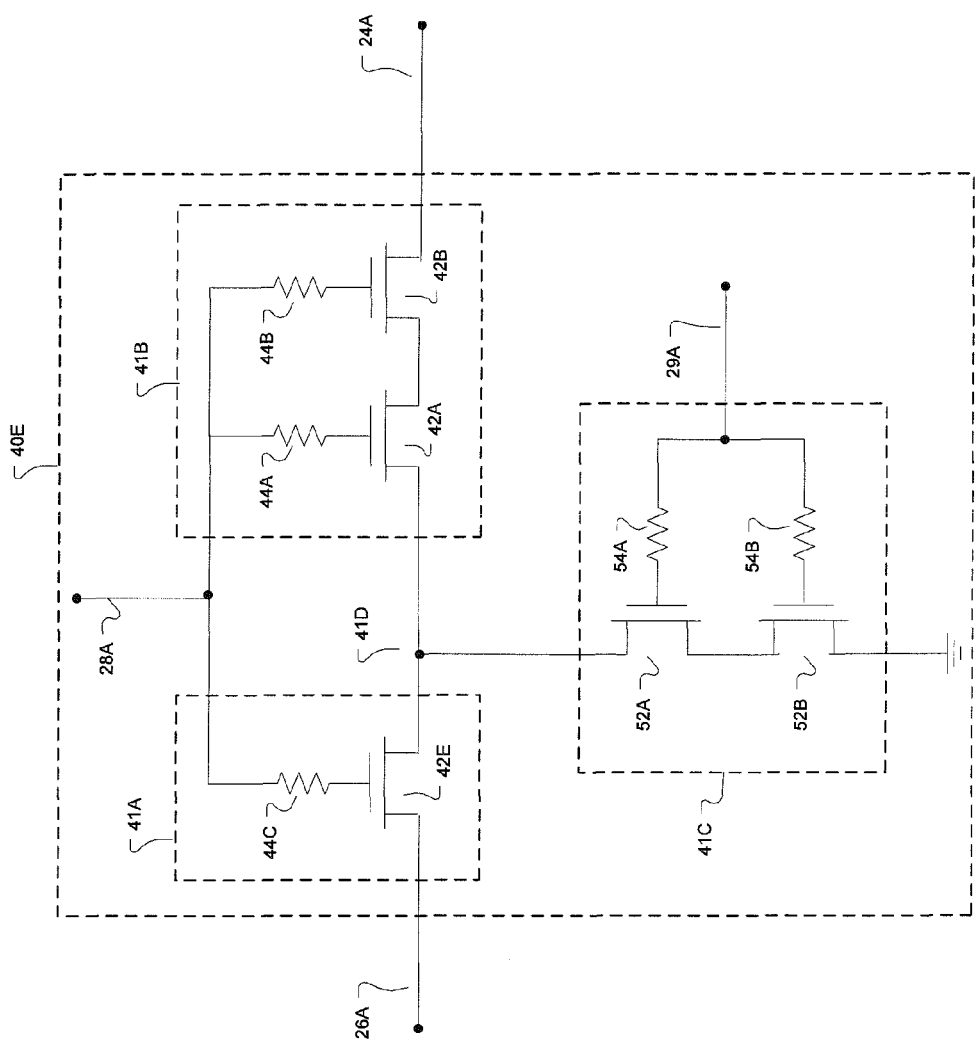
FIG. 2B is a block diagram of another RF switching module according to various embodiments.

FIG. 2B is a block diagram of an RF switching module 40E according to various embodiments. The RF switching module 40E may include a first switched module 41A, a second switched module 41B, and a shunt module 41C. The first and second switched module 41A, 41B may be coupled in series to communicate a signal on port 26A to port 24A as a function of a control signal on port 28A. The shunt module 41C may be coupled between the first and second switched modules 41A, 41B at a node 41D and to a ground. The shunt module may direct a signal at the node 41D to ground based on a control signal on the port 29A.

In an embodiment, modules 41A and 41B may be active when module 41C is inactive and module 41C may be active when modules 41A and 41B are inactive. When modules 41A and 41B are active and module 41C is inactive a signal on port 26A may be communicated to port 24A (to be communicated to a common node 50 as shown in FIG. 1) and be subject to insertion loss as a function of modules 41A, 41B configuration. When the shunt module 41C is active and switch modules 41A, 41B are inactive any signal on node 41D may be shunted to ground. The switch module 41B may be required to handle the load of a signal present at port 24A when inactive. Similarly, the switch module 41A may be required to handle the load of a signal present at port 26A when inactive.

Any capacitance present in the switch module 41B due to the transition from an active to inactive state may be communicated on the port or node 24A. In an embodiment the switch module 41B may include one or more elements (transistors) 42A, 42B where the transistors may be coupled in series (transistor 42A drain to transistor 42B source in an embodiment) and their gates coupled to the control port or node 28A via a resistor 44A, 44B, respectively (in an embodiment). In an embodiment the switch element 41A may include one or more transistors 42E where the transistor 42E gate may be coupled to the control port or node 28A via a resistor 44C, in an embodiment.

In an embodiment the effective off state capacitance of the elements 42A, 42B of the switch module 41B may be configured to be lower than the off state capacitance of the element 42E of the switch module 41A. As a consequence the voltage loading of the elements 42A, 42B of the switch module 41B may be lower than the voltage loading of the element 42E of the switch module 41A. In an embodiment the modules 41A, 41B, and 41C may be configured to have the same total voltage loading capacity.

In an embodiment the on or active resistance of the combined elements 42A and 42B of the switch module 41B may be configured to be higher than the on resistance of the element 42E of the switch module 41A. The increased combined on resistance of the elements 42A, 42B of module 41B with lower combined off state capacitance of these elements in conjunction with the lower on resistance of the element 42E of module 41A may reduce the insertion loss of a signal communicated from port 26A to port 24A when the modules 41A, 41B are active. The reduction in insertion loss is the result of a lower total loading capacitance at the common port (node 50 on FIG. 1) from the off state capacitance of multiple switch modules 40G connected to this common node or antenna port.

In an embodiment the shunt module 41C may also include one or more elements (transistors) 52A, 52B where the transistors may be coupled in series (transistor 52A drain to transistor 52B source in an embodiment) and their gates coupled to the control port or node 29A via a resistor 54A, 54B, respectively (in an embodiment). In an embodiment the module 41C and its respective elements 52A, 52B may be configured to have a total voltage capacity about equal to the total voltage capacity of the module 41A and the module 41B.

Figure 2C:
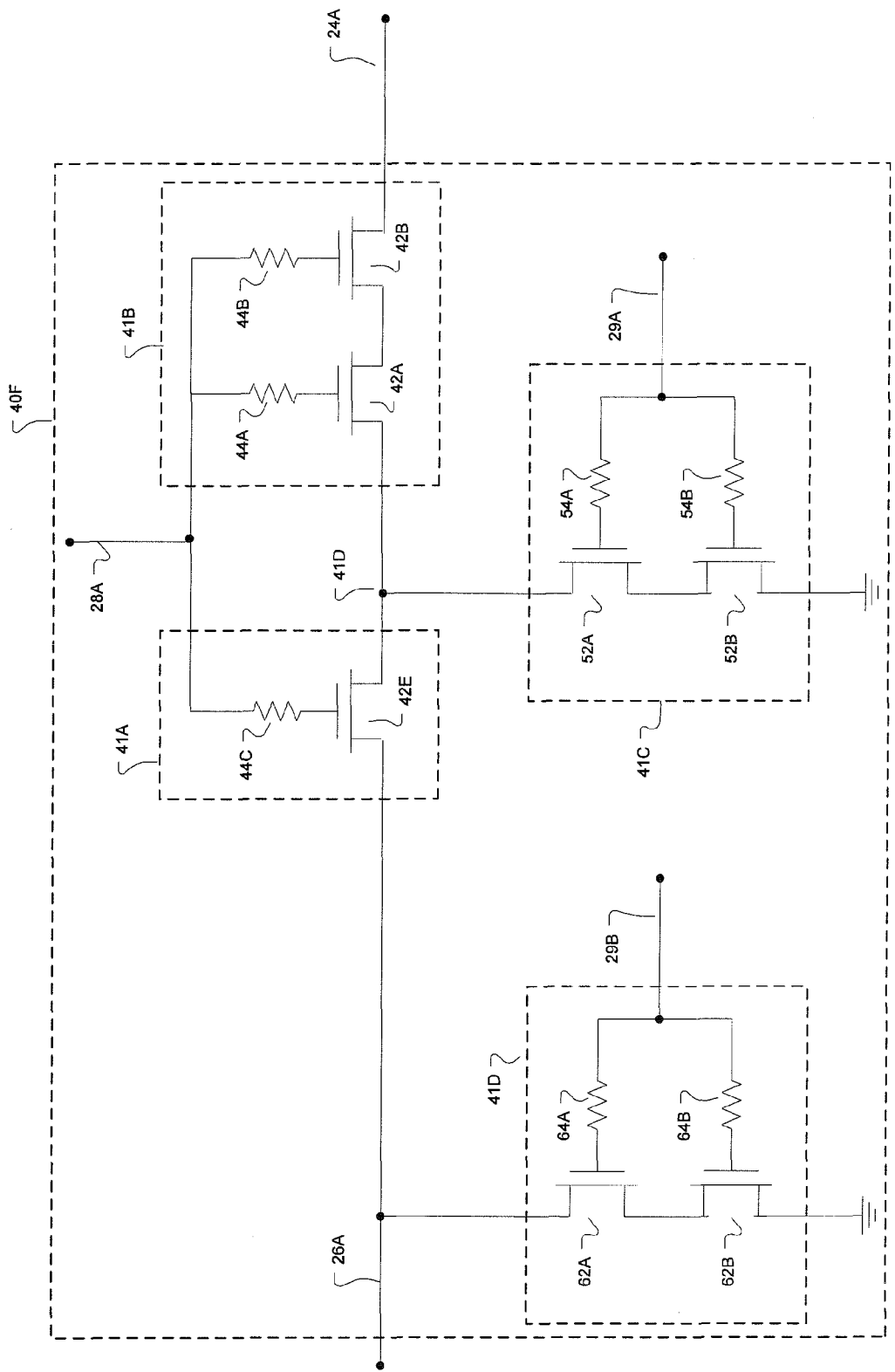
FIG. 2C is a block diagram of a further RF switching module according to various embodiments.

FIG. 2C is a block diagram of an RF switching module 40F according to various embodiments. The RF switching module 40F may include a first switched module 41A, a second switched module 41B, a first shunt module 41C, and a second shunt module 41D. Similar to module 40E the first and the second switched module 41A, 41B may be coupled in series to communicate a signal on port 26A to port 24A as a function of a control signal on port 28A. The first shunt module 41C may be coupled between the first and second switched modules 41A, 41B at a node 41D and to a ground. The first shunt module 41C may direct a signal at the node 41D to ground based on a control signal on the port 29A. The second shunt module 41D may be coupled between the node 26A and to a ground. The second shunt module 41D may direct a signal at the node 26A to ground based on a control signal on the port 29B.

In an embodiment the first and second shunt modules 41C, 41D may be made inactive when the modules 41A, 41B are active and made active when the modules 41A, 41B are inactive. The second shunt module 41D may help isolate the switch module 41A when the module 41A is inactive. In an embodiment the shunt module 41D may also include one or more elements (transistors) 62A, 62B where the transistors may be coupled in series (transistor 62A drain to transistor 62B source in an embodiment) and their gates coupled to the control port or node 29B via a resistor 64A, 64B, respectively. In an embodiment the module 41D and its respective elements 62A, 62B may be configured to have a total voltage capacity about equal to the total voltage capacity of the module 41A.

Figure 2D:
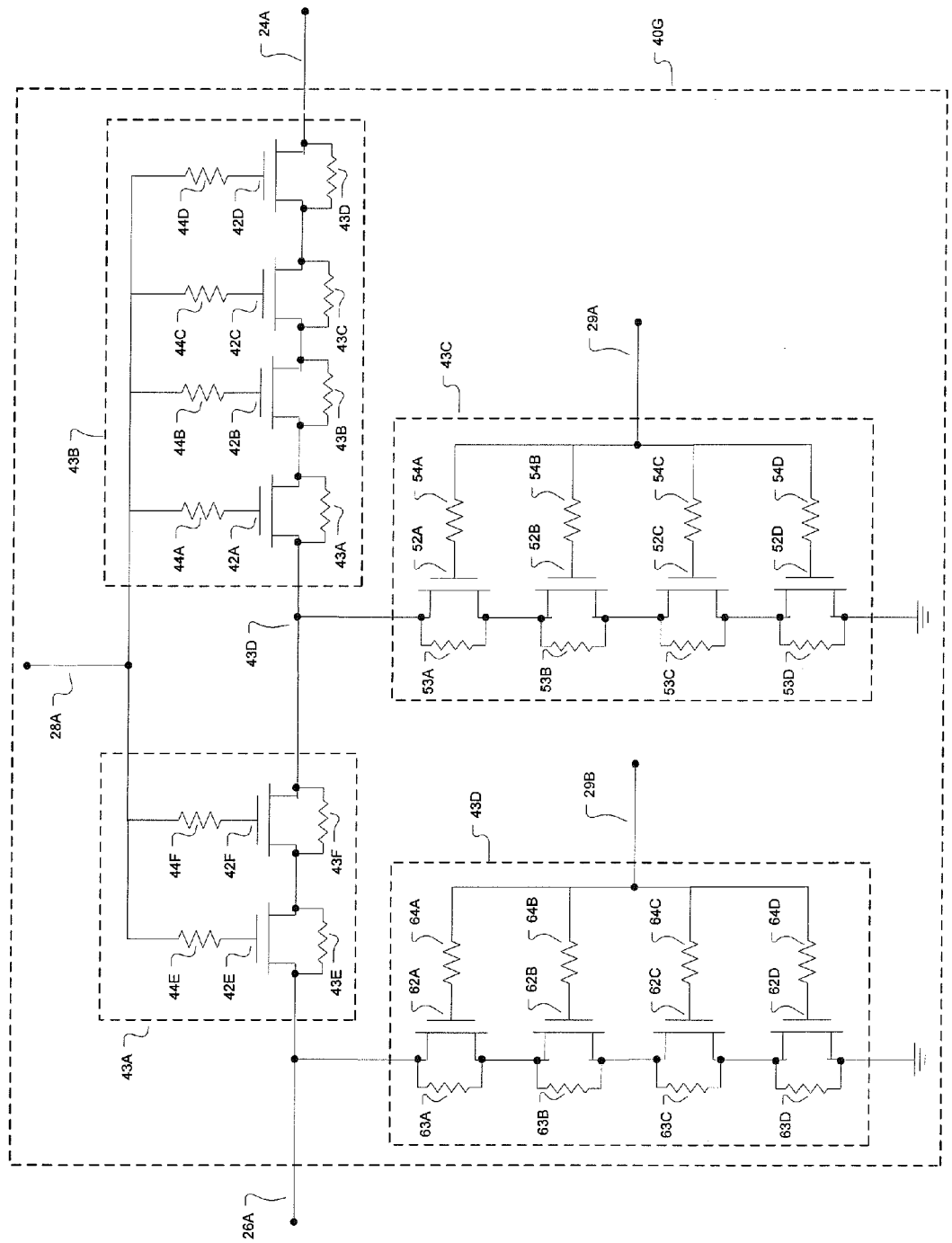
FIG. 2D is a block diagram of another RF switching module according to various embodiments.

FIG. 2D is a block diagram of an RF switching module 40G according to various embodiments. The RF switching module 40G may include a first switched module 43A, a second switched module 43B, a first shunt module 43C, and a second shunt module 43D. Similar to the switch module 40F the first and the second switched module 43A, 43B may be coupled in series to communicate a signal on port 26A to port 24A as a function of a control signal on port 28A. The first shunt module 43C may be coupled between the first and second switched modules 43A, 43B at a node 43D and to a ground. The first shunt module 43C may direct a signal at the node 43D to ground based on a control signal on the port 29A. The second shunt module 43D may be coupled between the node 26A and to a ground. The second shunt module 43D may direct a signal at the node 26A to ground based on a control signal on the port 29B.

In an embodiment the first and second shunt modules 43C, 43D may be made inactive when the modules 43A, 43B are active and made active when the modules 43A, 43B are inactive. As shown in FIG. 2D the first switch module 43A may include two transistors 42E, 42F coupled in series where their gates are coupled to the control port 28A via the resistors 44E, 44F, respectively. The second switch module 43B may include four transistors 42A, 42B, 42C, 42D coupled in series where their gates are coupled to the control port 28A via the resistors 44A, 44B, 44C, 44D respectively. The first shunt switch module 43C may include four transistors 52A, 52B, 52C, 52D coupled in series where their gates are coupled to the control port 29A via the resistors 54A, 54B, 54C, 54D respectively. Similarly, the second shunt module 43D may include four transistors 62A, 62B, 62C, 62D coupled in series where their gates are coupled to the control port 29B via the resistors 64A, 64B, 64C, 64D respectively.

In an embodiment the effective capacitance of the elements 42A, 42B, 42C, 42D of the switch module 43B may be configured to be lower than the capacitance of the elements 42E, 42F of the switch module 43A. As a consequence the voltage loading of the elements 42A, 42B, 42C, 42D of the switch module 43B may be lower than the voltage loading of the elements 42E, 42F of the switch module 43A. In an embodiment the modules 43A, 43B, 43C, and 43D may be configured to have the same total voltage loading capacity In an embodiment the combined on or active resistance of the elements 42A, 42B, 42C, 42D of the switch module 43B may be configured to be higher than the combined on resistance of the elements 42E, 42F of the switch module 43A. The increased combined on resistance of the elements 42A, 42B, 42C, 42D of module 43B with decreased combined off state capacitance of these elements in conjunction with the lower combined on resistance of the elements 42E, 42F of module 43A y may reduce the insertion loss of a signal communicated from port 26A to port 24A when the modules 43A, 43B are active. The reduction in insertion loss is the result of a lower total loading capacitance at the common port (node 50 on FIG. 1) from the off state capacitance of the multiple switch modules 40G connected to this common node or antenna port.

In an embodiment the transistors 62A to 62D of the shunt module 43D and 62A, 62B of shunt module 41D may have a width, length of about 18 microns, 0.4 microns and 22 fingers and a resistance of about 40.91 Kohms. The transistors 52A to 52D of the shunt module 43C and transistors 52A, 52B of shunt module 41C may have a width, length of 17.8 microns, 0.4 microns and 56 fingers and a resistance of about 51.65 Kohms. The first switch module 43A elements 42E, 42F and 41A elements 42E may have a width, length of 31.2 microns, 0.4 microns and 77 fingers and a resistance of about 58.0 Kohms. The second switch module 43B elements 42A, 42B, 42C, 42D and switch module 41B elements 42A, 42B may have a width, length of 17.8 microns, 0.4 microns and 56 fingers and a resistance of about 40.91 Kohms. The resistors 44A to 44D, 54A to 54D, 64A to 64D may have a nominal resistance of about 2.65 K-ohms.

The accompanying drawings that form a part hereof show, by way of illustration and not of limitation, specific embodiments in which the subject matter may be practiced. The embodiments illustrated are described in sufficient detail to enable those skilled in the art to practice the teachings disclosed herein. Other embodiments may be utilized and derived there-from, such that structural and logical substitutions and changes may be made without departing from the scope of this disclosure. This Detailed Description, therefore, is not to be taken in a limiting sense, and the scope of various embodiments is defined only by the appended claims, along with the full range of equivalents to which such claims are entitled.

Such embodiments of the inventive subject matter may be referred to herein individually or collectively by the term "invention" merely for convenience and without intending to voluntarily limit the scope of this application to any single invention or inventive concept, if more than one is in fact disclosed. Thus, although specific embodiments have been illustrated and described herein, any arrangement calculated to achieve the same purpose may be substituted for the specific embodiments shown. This disclosure is intended to cover any and all adaptations or variations of various embodiments. Combinations of the above embodiments, and other embodiments not specifically described herein, will be apparent to those of skill in the art upon reviewing the above description.

The Abstract of the Disclosure is provided to comply with 37 C.F.R. §1.72(b), requiring an abstract that will allow the reader to quickly ascertain the nature of the technical disclosure. It is submitted with the understanding that it will not be used to interpret or limit the scope or meaning of the claims. In the foregoing Detailed Description, various features are grouped together in a single embodiment for the purpose of streamlining the disclosure. This method of disclosure is not to be interpreted to require more features than are expressly recited in each claim. Rather, inventive subject matter may be found in less than all features of a single disclosed embodiment. Thus the following claims are hereby incorporated into the Detailed Description, with each claim standing on its own as a separate embodiment.

What is claimed is:

1. A switch apparatus for communicating a signal received on a first port to a second port as a function of a first control signal, CS1, including:
    a first switch module, SW1 coupled to the first port and an intermediate port, the SW1 including at least one controllable element, CE1, the CE1 controlled by the CS1 and having an off capacitance, OC1;
    a second switch module, SW2 coupled to the intermediate port and the second port, the SW2 including at least one controllable element, CE2, the CE2 controllable by the CS1 and the CE2 having an off capacitance, OC2; and
    a first shunt module, SH1 coupled to the intermediate port and ground, the SH1 including at least third controllable element, CE3, the SH1 controllable by a second control signal, CS2,
    wherein OC1 is greater than OC2.

2. The switch apparatus of claim 1, wherein the SW1 elements total series off capacitance, TC1 is larger than the SW2 elements total series off capacitance, TC2.

3. The switch apparatus of claim 2, the SW1 including a plurality of serially coupled controllable elements, each controllable by the CS1 and having an off capacitance of about OC1 and the SW2 including a plurality of serially coupled controllable elements, each controllable by the CS1 and having an off capacitance of about OC2.

4. The switch apparatus of claim 3, wherein the SW1 has a total voltage handling capacity, VC1 and the SW2 has a total voltage handling capacity, VC2, and VC1 is smaller or about equal to VC2.

5. The switch apparatus of claim 3, wherein the SH1 has a total voltage handling capacity, VC3 and VC2 is about equal to VC3.

6. The switch apparatus of claim 2, wherein he CE1 has an effective resistance, R1, CE2 has an effective resistance, R2, and R1 is less than R2.

7. The switch apparatus of claim 2, wherein the SW1 elements are transistors, the SW2 elements are transistors, and the SH1 elements are transistors.

8. The switch apparatus of claim 2, wherein the SW1 elements are CMOS transistors, SW2 elements are CMOS transistors, and the SH1 elements are CMOS transistors.

9. The switch apparatus of claim 8, wherein the SW1 CMOS transistors gates and the SW2 CMOS transistors gates are coupled to the CS1 and the SH1 CMOS transistors gates are coupled to the CS2.

10. The switch apparatus of claim 2, further comprising a second shunt module, SH2 coupled to the first port and ground, the SH2 including at least a fourth controllable element, CE4, the SH2 controllable by the second control signal, CS2.

11. The switch apparatus of claim 10, further comprising one of an antenna node and a common node coupled to the first port and wherein the second port is coupled to the other of the antenna node and the common node.

12. The switch apparatus of claim 10, wherein the SW1 and the SW2 are radio frequency (RF) switches.

13. The switch apparatus of claim 10, wherein the SH2 has a total voltage handling capacity, VC4 and VC4 is about equal to VC3.

14. The switch apparatus of claim 13, wherein the SH2 elements are CMOS transistors.

15. The switch apparatus of claim 14, wherein the SH2 CMOS transistors gates are coupled to the CS2.

16. The switch apparatus of claim 2, wherein SW2 further includes another controllable element, CE5 coupled in series with the controllable element CE2, the CE5 controllable by the CS1 and the CE5 having an off capacitance, OC5 and wherein OC1 is greater than OC5.

17. A method of communicating a signal received on a first port to a second port as a function of a first control signal, CS1, including:
    employing a first switch module, SW1 coupled to the first port and an intermediate port, the SW1 including at least a first controllable element, CE1, the CE1 controlled by the CS1 and having an off capacitance, OC1 to communicate the signal from the first port to the intermediate port when active;
    employing a second switch module, SW2 coupled to the intermediate port and the second port, the SW2 including at least a second controllable element, CE2 , the CE2 controllable by the CS1 and the CE2 having an off capacitance, OC2 to communicate the signal from the intermediate port to the second port when active; and
    employing a first shunt module, SH1 coupled to the intermediate port and ground, the SH1 including at least a third controllable element, CE3, the SH1 controllable by a second control signal, CS2 to communicate signals from the intermediate port to ground when active,
    wherein OC1 is greater than OC2.

18. The method of claim 17, wherein the SW1 elements total series off-state capacitance, TC1 is larger than the SW2 elements total series off-state capacitance, TC2.

19. The method of claim 18, wherein the SW1 has a total series on resistance, R1, SW2 has a total series on resistance, R2 and R1 is less than R2.

20. The method of claim 18, wherein the SW1 and the SW2 are made active via the CS1 when the SH1 is made not active via the CS2 and the SW1 and SW2 are made inactive via the CS1 when the SH1 is made active via the CS2.

* * * * *